(12) United States Patent
Engel (10) Patent No.: US 8,072,119 B2
(45) Date of Patent: Dec. 6, 2011

(54) PIEZOELECTRIC COMPONENT

(75) Inventor: Guenter Engel, Leibnitz (AT)

(73) Assignee: Epcos AG, Munich (DE)

( * ) Notice: Subject to any disclaimer, the term of this patent is extended or adjusted under 35 U.S.C. 154(b) by 75 days.

(21) Appl. No.: 12/508,285

(22) Filed: Jul. 23, 2009

(65) Prior Publication Data

US 2010/0007243 A1 Jan. 14, 2010

Related U.S. Application Data

(63) Continuation of application No. PCT/EP2008/050578, filed on Jan. 18, 2008.

(30) Foreign Application Priority Data

Jan. 23, 2007 (DE) .......................... 10 2007 003 280

(51) Int. Cl.
*H01L 41/047* (2006.01)

(52) U.S. Cl. .......................... 310/322; 310/321; 310/366

(58) Field of Classification Search .................. 310/322, 310/321, 366
See application file for complete search history.

(56) References Cited

U.S. PATENT DOCUMENTS

| | | | |
|---|---|---|---|
| 4,936,303 A * | 6/1990 | Detwiler et al. .................. | 601/3 |
| 5,278,471 A | 1/1994 | Uehara et al. | |
| 5,860,202 A | 1/1999 | Okawa et al. | |
| 6,346,764 B1 | 2/2002 | Boyd | |
| 6,739,704 B2 * | 5/2004 | Takahashi ........................ | 347/72 |
| 6,765,337 B1 | 7/2004 | Heinz et al. | |
| 7,003,858 B2 | 2/2006 | Sube et al. | |
| 2002/0096973 A1 * | 7/2002 | Zhang et al. ................... | 310/334 |
| 2002/0180417 A1 * | 12/2002 | Colby et al. .............. | 324/117 R |
| 2003/0133230 A1 * | 7/2003 | Hida et al. .................. | 360/294.4 |
| 2006/0175930 A1 * | 8/2006 | Ganor et al. .................. | 310/317 |
| 2006/0226737 A1 * | 10/2006 | Miyazawa et al. ....... | 310/323.02 |

FOREIGN PATENT DOCUMENTS

| | | |
|---|---|---|
| DE | 2 202 254 | 6/1973 |
| DE | 198 02 302 A1 | 7/1999 |
| DE | 102 24 566 A1 | 12/2003 |
| DE | 10 2005 015 600 A1 | 10/2006 |
| GB | 1 402 352 | 1/1973 |

* cited by examiner

*Primary Examiner* — Walter Benson
*Assistant Examiner* — Bryan Gordon
(74) *Attorney, Agent, or Firm* — Slater & Matsil, L.L.P.

(57) ABSTRACT

A piezoelectric component with a body in which electrically connected transducer elements are realized is disclosed. The transducer elements are separated from each other by an essentially field-free neutral region of the body. A first transducer element has electrically connected first electrodes, and a second transducer element has electrically connected second electrodes. In addition, at least one third electrode, which is arranged in the first and second transducer element is provided. At least three of the first and third electrodes are arranged in an alternating sequence. At least three of the second and third electrodes are arranged in an alternating sequence. The neutral area is perpendicular to the planes in which the electrodes are arranged.

18 Claims, 8 Drawing Sheets

PIEZOELECTRIC COMPONENT

This application is a continuation of co-pending International Application No. PCT/EP2008/050578, filed Jan. 18, 2008, which designated the United States and was not published in English, and which claims priority to German Application No. 10 2007 003 280.5 filed Jan. 23, 2007, both of which applications are incorporated herein by reference.

BACKGROUND

A piezoelectric component is known, for example, from the U.S. Pat. No. 6,346,764 B1.

SUMMARY

A piezoelectric component and a component arrangement with a piezoelectric component that is capable of oscillation are each characterized by high efficiency.

According to a first preferred embodiment, a piezoelectric component that comprises a body with piezoelectric properties is specified. The body comprises alternatingly stacked piezoelectric layers and electrode planes with first, second, and third electrodes arranged therein. At least one first electrode, at least one second electrode, and at least one third electrode are provided. Preferably, a plurality of first electrodes and a plurality of second electrodes are provided. The minimum of one third electrode, preferably has at least one inwardly lying third electrode arranged in the body.

Electrically and mechanically connected transducer elements that are spaced apart from each other by an essentially field-free and, thus, stress-free neutral region of the body are realized in the body. A first transducer element has electrically connected first electrodes. A second transducer element has electrically connected second electrodes. At least one third electrode, which is arranged both in the first and in the second transducer element, is arranged in the body. At least three electrodes selected from the first and third electrodes are arranged in an alternating sequence. At least three electrodes chosen from the second and third electrodes are arranged in an alternating sequence one on top of the other. The neutral region is directed perpendicular to the lateral planes in which the electrodes are arranged. More than just two transducer elements can be integrated into the body, where at least two of the transducer elements or all of the transducer elements are preferably electrically connected to each other. The relevant transducer element is arranged in a series branch or cross branch of an electrical circuit that is formed.

The piezoelectric component is intended for conversion of electrical energy to mechanical energy or vice versa. The piezoelectric component can be used as an actuator to stimulate mechanical oscillations of an oscillatable membrane. The piezoelectric component can also be used as a sensor element that is intended to convert a mechanical deformation, in particular, the acoustic oscillation of a membrane, to an electrical signal. The piezoelectric component can, for example, be used as a microphone element in a microphone arrangement.

In another advantageous variation, the piezoelectric component serves to stimulate vibrations of a loudspeaker membrane, with which it is firmly connected to form a component arrangement or a loudspeaker arrangement. The component arrangement is explained below, without limiting it to the use in loudspeakers or to the use of the piezoelectric component as an actuator.

The piezoelectric component is preferably designed as a plate or a bending oscillator with high piezoelectric coupling.

The piezoelectric component is characterized by high energy density that is concentrated in a comparably small space. The capacitance distribution in the piezoelectric component is considerable for the absorbed current and losses, since the reactive power increases with increasing capacitance. By dividing an electromechanical functional unit integrated in the body into two transducer elements, it is possible to achieve an especially small capacitance in the piezoelectric component, and, thus, high piezoelectric efficiency at low current consumption. Conversely, for sensor applications, where the piezoelectric component is to deliver current to an electrical circuit, high energy density in a usable signal can be achieved through the low capacitance of the piezoelectric component.

Through the appropriate design of the transducer elements, including the appropriate choice of material, number, and thickness of the piezoelectric layers and the lateral dimensions of the transducer elements, the energy that is to be converted in the loudspeaker arrangement can preferably be converted where stimulation of mechanical oscillations is desired. PZT ceramics with any formulations or other suitable piezoelectric ceramics with low loss angle are possibilities for the piezoelectric layers.

Other improvements can be achieved through the type of external contacts of the piezoelectric component. The external contacts can be produced, for example, by application and subsequent firing of a silver-containing metal paste or by depositing a metal layer by sputtering. The external contacts can have several layers of different materials.

The transducer elements each can be controlled by a control voltage. The control voltage contains a useful signal, which is preferably superimposed with a DC voltage. By application of the DC voltage, thus, by applying bias to the relevant transducer element, a sound level can be preset. In an advantageous variation, the DC voltage is frequency-dependent. The DC voltage can rise or fall with frequency. In particular, it is possible to bias one transducer element with a DC voltage that rises with frequency and the other transducer element with a DC voltage that falls with frequency.

With suitable biasing of the transducer elements, a frequency-dependent signal conversion to membrane oscillations can be achieved.

The acoustic oscillations of a loudspeaker membrane are stimulated by the piezoelectric component coupled to them. As a rule, the loudspeaker arrangement has a natural characteristic oscillation in the range of 600 Hz to 1 kHz. Preferably, another natural oscillation of the loudspeaker arrangement, the resonance frequency of which is greater than the frequency of the first natural oscillation, is also piezoelectricity stimulated. The frequency of the second natural oscillation preferably lies above 5 kHz, preferably in the range of 6 kHz, for example, between 5.5 kHz and 6.5 kHz or above 6 kHz.

The neutral region is arranged between the transducer elements. The transducer elements are, thus, arranged side-by-side, but spaced apart from each other, and are essentially mechanically decoupled from one another by the introduction of the stress-free and deformation-free neutral region. The transducer elements arranged side-by-side preferably have essentially the same or symmetric construction and, in particular, essentially the same capacitance value.

In an advantageous variation, at least two galvanically separated electrodes of different transducer elements are arranged in an electrode plane. The first electrodes and second electrodes can each be contacted from outside the body. The third electrodes can, but do not have to, be able to be contacted from outside.

By appropriate dimensioning of the third electrodes and the piezoelectric layers, it is, in particular, possible to reduce the capacitance and/or the loss angle. Preferably, a very small capacitance and a very small loss angle are established at a relatively large electrode area and thin layer thickness. The capacitance of the transducer element in each case is preferably a maximum of 2 µF.

In an advantageous variation, the piezoelectric layers contain a ceramic with piezoelectric properties. Polarized ferroelectrical ceramics such as lead zirconate titanate are especially well suited for stimulating lateral oscillations with piezoelectric coefficient $d_{13}$ to achieve a flat frequency response of the oscillatable component arrangement.

The thickness of each individual piezoelectric layer can, in the specified piezoelectric component, be chosen to be particularly small. For the same control voltage, this increases the field strength in the relevant layer, so that particularly high deflections become possible.

In an advantageous variation, the body is made mirror symmetric with respect to the plane in which the central point of the body lies, and that is perpendicular to the layers of the body.

According to a second preferred embodiment, a component arrangement with a membrane and a piezoelectric component firmly bonded to it is specified. The piezoelectric component is provided to stimulate at least two oscillation modes of the component arrangement. The piezoelectric component preferably has at least two transducer elements realized in a body, between which there is a neutral region.

Due to the firm connection between the membrane and the body of the piezoelectric component, the body cannot expand in a region immediately adjacent to the membrane. A region of the body that is turned away from the membrane, on the other hand, can expand in the lateral direction. This forces bending deformations of the component arrangement.

The region of the relevant transducer element that is affixed to the membrane and turned toward the membrane, thus, forms a lateral clamping region of the transducer element. Since the neutral region arranged between the transducer elements is essentially stress-free, it acts as if the relevant transducer elements were clamped to the region that is adjacent to the neutral region. Thus, the neutral region forms a vertical clamping region for the relevant transducer element.

In the clamping regions and their vicinity, there is practically no expansion of a relevant transducer element in the lateral direction. This results in all the greater lateral expansion taking place at the opposite free end of the transducer element. Thus, through the introduction of the neutral region, the bending deformation of the body or the component arrangement is enhanced.

According to a third preferred embodiment, a component arrangement with a membrane and a piezoelectric component firmly connected to it is specified, where the piezoelectric component has at least two transducer elements realized in one body. Preferably, the main surface of the body is affixed to the membrane.

The transducer elements are preferably arranged side-by-side, and in an advantageous variation, are decoupled from each other by an essentially stress-free neutral region.

The transducer elements are preferably independently controllable. The control of two transducer elements by two independent control signals can be used, in particular, to equalize the frequency response of the acoustic pressure produced by the component arrangement, for example, by stimulating at least two oscillation modes or by deliberately flattening the resonance of one mode by reducing the quality of the component arrangement. The quality of the component arrangement is understood to mean the ratio of the resonance frequency, at which the maximum oscillation amplitude of the membrane is achieved, to the difference of the frequencies at a certain level of oscillation amplitude, for example, 3 dB.

A stereo signal can be converted to membrane oscillations using just one piezoelectric component through the independent control of the transducer elements.

According to a fourth preferred embodiment, a piezoelectric component with at least one transducer element, which is controlled by a frequency-dependent control voltage, is specified. The component has a body, in which, in an advantageous variation, at least two transducer elements are realized, each of which is controlled by at least one frequency-dependent control voltage.

The piezoelectric component is preferably connected to a membrane that is capable of oscillation.

According to a fifth preferred embodiment, there is specified a component arrangement having a membrane capable of oscillation, and a piezoelectric component connected firmly to it, which has at least two transducer elements arranged one above the other, which have piezoelectric layers of different thicknesses, i.e., different distances between differently polarized electrodes. The transducer elements are preferably electrically connected to each other.

The transducer elements arranged one above the other can have different numbers of piezoelectric layers and electrodes.

In an advantageous variation, a bridge circuit of four transducer elements is possible. In this case, preferably two transducer elements are arranged one above the other, and two transducer elements are arranged side-by-side.

The body has at least two side-by-side lateral regions that are decoupled from each other by the neutral region. One of the transducer elements is arranged in each lateral region.

The transducer elements are arranged one on top of the other or side-by-side are separately controllable in one variation. Preferably, the lower transducer elements are with a common first control signal and the upper transducer elements are controlled with a second control signal. With the separate control of different lateral regions of the body, it becomes possible to affect the piezoelectric activity in the piezoelectric element and thus the frequency response of the component arrangement, as well.

In principle, an essentially field-free region that extends in a lateral direction can be provided between two transducer elements arranged one above the other. Through the stacking of different transducer elements on top of each other, it is possible to achieve a shift of the resonance frequencies of the component arrangement and to stimulate more than just one oscillation mode.

The advantageous embodiments of the piezoelectric component and the component arrangement with a piezoelectric component can be combined with each other in any desired way.

For all embodiments of the component arrangement, the higher frequency oscillation mode of the oscillation modes that are to be stimulated by means of the piezoelectric component is preferably set to be above 5 kHz. In an advantageous variation, the resonance curves of the minimum of two oscillation modes overlap, so that the frequency response of the component arrangement in the specified useful region has a power drop of no more than 3 dB with respect to the maximum oscillation amplitude of the component arrangement. This can be brought about, in particular, by realizing two or more transducer elements in one body and by the variations of control of the transducer elements that are explained below.

In what follows, the properties and structure of the specified component and its advantageous embodiments are explained in more detail.

The body is preferably designed as a slab in which lateral deflections with a piezoelectric coefficient $d_{13}$ are produced by an electrical signal.

The smallest lateral dimension of the slab, i.e., its width, preferably exceeds its thickness by a minimum factor of five. The thickness of the slab in an advantageous variation is a maximum of 10%, in another variation, a maximum of 5% of the lateral width of the slab.

The lateral dimensions, i.e., the length and width of the slab are chosen in one variation to be between 10 and 40 mm. The thickness of the slab is preferably a maximum of 200 μm. The slab dimensions in one variation are 15 mm×20 mm×120 μm.

The slab preferably has between 4 and 20 piezoelectric layers. The thickness of the layers is preferably between 10 and 50 μm.

The slab can be made rectangular or in the form of a disc. The shape of the slab is preferably matched to that of the membrane. For example, it is advantageous to couple a rectangular slab to a rectangular membrane or a disc-shaped slab to a round membrane.

The electrodes and the piezoelectric layers are preferably directed parallel to the main surface of the body. Preferably, the relevant third electrode is arranged between two first electrodes and between two second electrodes. In a preferred variation, there are a plurality of third electrodes. Preferably, at least one of the first electrodes and at least one of the second electrodes is arranged between two third electrodes.

The electrodes of the relevant transducer element that are to be galavanically connected together are preferably connected together by a conducting surface arranged on the side surface of the body and provided as a collecting electrode and an external terminal. The electrodes are preferably held back from the surface of the body except from the terminal regions in which the electrode is connected to the relevant external terminal.

The third electrodes are galavanically separated from the first and from the second electrodes. The first and second electrodes can be galavanically separated from each other and can be connected to their own associated external terminals of the component. The first and second electrodes can, however, also be electrically connected to a common external terminal of the component, for example, if the intention is to control a parallel circuit of the transducer elements by a common control signal.

In one variation, the third electrodes are made as reactive electrodes. A reactive electrode is understood to be an electrode that is not intended for electrical circuitry with a specific electrical potential, even if the reactive electrodes can be connected to an external terminal, to be able to connect the reactive electrodes, for example, in the case of generation of prepolarization in the piezoelectric layers.

In one variation, the third electrodes are electrically isolated from each other and are made as floating electrodes. The floating electrodes, in one variation, are galavanically separated from each other and from other electrodes of the transducer elements. However, the third electrodes can also be electrically connected to each other. In this case, they can be connected to an external terminal of the piezoelectric element that is arranged on the surface of the body.

The transducer elements are controlled with at least one control signal. The relevant transducer element is controlled with a control signal that has an alternating voltage component.

In an advantageous variation, the transducer elements are biased by applying an electrical DC voltage. A preset operating point of the piezoelectric element is established with the DC voltage. A desired contribution of the modulus of elasticity of the piezoelectric layers and, thus, a certain dynamic range of the component arrangement can be established in each case according to the level of the DC voltage. This value is then modulated by a useful signal. The useful signal is an AC voltage with which the acoustic oscillation of the component arrangement is stimulated. An acoustic useful signal is generated, for example, by an audio chip that has an amplifier element.

By changing the modulus of elasticity of the piezoelectric component, it is possible to affect the resonance frequency of the loudspeaker arrangement, thus, the natural frequency of the relevant oscillation mode, and, in particular, to raise it. The elastic constant increases with the square of the electrical field strength. In this way, there is the possibility of controlling the elastic constant or the modulus of elasticity of the piezoelectric material through the electrical biasing of the piezoelectric component, in particular, to raise it.

In particular, it is possible to affect the oscillation mode with the higher natural frequency. The resonance frequency of the higher mode can be shifted in a tailored way to a higher frequency, which lies above the preset useful range of the loudspeaker arrangement. However, the frequency of the oscillation mode with the lower natural frequency can also be shifted, in particular, raised.

By changing the E modulus of the piezoelectric material in a transducer element of the piezoelectric component, it is possible, for example, to make a fine adjustment of the resonance frequency by a few percent. In particular, by applying a DC control voltage superimposed with an acoustic useful signal, the resonance frequency can be raised.

The useful signal in an advantageous variation is superimposed by the DC voltage signal to form a control signal. The amplitude of the DC voltage is preferably greater than that of the useful signal.

The control signal, therefore, is composed of a useful signal within the AC component and a DC voltage signal of positive or negative polarity. The positive or negative electrical potential and the useful signal can be applied to the same electrodes of the relevant transducer element. The DC voltage component and useful signal can, however, also be applied to different electrodes of the transducer element.

Different transducer elements of the piezoelectric component can be controlled by a common control signal.

At least two of the electrically connected transducer elements realized in a common body can be connected in series, for example. In the control, the control signal is preferably applied to the series circuit of transducer elements.

Alternatively, at least two of the transducer elements can be connected in parallel, and the control signal is applied to the parallel circuitry of the transducer elements. In one variation, the control signal is applied to the first and the second electrodes of the piezoelectric component, and a minimum of one third electrode is connected to a reference potential.

In one variation, control of the transducer elements takes place via the common electrodes. The control signal, in this case, is applied to the minimum of one third electrode. The first electrodes then are preferably connected to a first reference potential and the second electrodes are connected to a second reference potential. The first and second electrodes can also be connected to a common reference potential.

A relevant reference potential can be a null potential or ground. The reference potential can be replaced by a DC voltage of positive or negative polarity. In one variation, a minimum of one third electrode supplies a DC control voltage with positive or negative polarity. In another variation, the first and/or second electrodes are provided to supply the DC control voltage.

According to another variation, the transducer elements can be independently controlled, i.e., controlled by different control signals. For example, a first control signal is applied to the first electrodes and a second control signal to the second electrodes. The third electrodes, in this case, are preferably connected to a reference potential.

The transducer elements, in particular, transducer elements arranged side-by-side, can be connected to a common reference potential or different reference potentials, as in the case of control with one control signal and also in the case of control with more than one control signal.

There are various possibilities for establishing a comparably high efficiency for efficient conversion of electrical energy to mechanical or vice versa.

A connection between the body of the piezoelectric component and membrane that is as rigid as possible is advantageous for efficient conversion of the electrical energy of the control signal to the oscillations of the membrane. The connecting layer arranged between the body and the membrane, in this case, is preferably stiff, i.e., not elastic. The connecting layer is preferably made so that the underside of the body is connected to the membrane over the entire surface of the body, thus, without hollows or gaps. However, a minimum of one gap, for example, between the neutral region of the body and the membrane, can be provided to establish the desired efficiency.

The connecting layer or adhesive layer is preferably thin, for example, a maximum of 20 μm thick, in an advantageous variation 5 to 10 μm thick. The adhesive layer is preferably electrically isolating.

The efficiency of the component arrangement can also be increased by appropriate dimensioning of the neutral region of the body. For example, the width of the neutral region measured in the neutralized direction of the body is chosen to be greater than the minimum width required for mechanical decoupling of the transducer elements from each other. The minimum width of the neutral region in one variation is 200 μm. The width of the neutral region is preferably a maximum of 500 μm, and in an advantageous variation, it is a maximum of 300 μm.

It is advantageous to make the distance between the electrode planes of a transducer element, i.e., the thickness of the relevant piezoelectric layer, different in different lateral regions of the body, to be able to achieve a bending stress that is as large as possible. The field strength in the relevant piezoelectric layer becomes greater while the electrical voltage remains the same due to the smaller electrode spacing. For this reason, it is advantageous to reduce the thickness of the piezoelectric layers in those regions of the body in which a greater deflection of the body to achieve a large bending stress is desired. This is the case, for example, in a lateral region of the body turned away from the membrane that is not affixed to the membrane. Accordingly, it is advantageous if the layer of thickness or the spacing between the electrode planes in the region of the body turned toward the membrane is chosen to be greater than in the region turned away from the membrane.

A relevant piezoelectric layer is characterized by a polar axis. The piezoelectric layers with positive and negative direction of polarization are preferably alternatingly arranged one on top of the other.

The piezoelectric layers of the body are prepolarized to establish a preferential direction of domains that have a polarization. The polarization field is, for example, 1-3 kV/mm. In operation, an electrical field up to 200 V/mm per layer can be achieved.

To establish an operating point, it is advantageous to apply a DC voltage with a sign for which the electrical field corresponds with the direction of polarization of the layer.

In an advantageous variation, the polarization axes of the relevant piezoelectric layer are aimed in the same direction in the region of the first and the second transducer elements. This is the case, for example, when in generating a prepolarization, the polarization voltage was applied to a parallel circuit of the transducer elements.

In another advantageous variation, the polarization axes of the relevant piezoelectric layer are oppositely directed in the region of the first and the second transducer elements. This is the case, for example, when in the generation of a prepolarization, the polarization voltage is applied to the series circuitry of the transducer elements.

In one variation, the control voltage is applied during the operation of the piezoelectric component, so that the electrical field in the relevant piezoelectric layer is aimed in the same direction in the region of the first and the second transducer elements. This is the case, for example, when a parallel bias is applied to the parallel circuitry of the transducer elements.

In another variation, the control voltage is applied in the operation of the piezoelectric component so that the electrical field in the relevant piezoelectric layer is oppositely directed in the region of the first and the second transducer elements. This is the case, for example, when an electrical bias is applied to the series circuitry of the transducer elements.

The direction of polarization of the operating voltage can be parallel to the direction of the polar axes of the relevant piezoelectric layer, where the polarization axis and the electrical field are aimed in the same direction. The direction of polarization of the operating voltage and the direction of the polar axis can also be antiparallel, where the polarization axis and the electrical field are aimed opposite to each other.

In an advantageous variation both in the generation of the prepolarization of the piezoelectric layers, a polarization voltage, and also in operation, the control voltage is applied to the series circuitry or to the parallel circuitry of the transducer elements. In this case, the direction of polarization of the operating voltage and the orientation of the polar axes of the relevant piezoelectric layer are parallel in the two side-by-side transducer elements.

In another variation, it is possible to apply the polarization voltage to the series circuitry of the transducer elements in the generation of the prepolarization and to apply the control voltage to the parallel circuitry of the transducer elements in operation. Alternatively, it is possible to apply the polarization voltage to the parallel circuitry of the transducer elements in the generation of the prepolarization and the control voltage to the series circuitry of the transducer elements in operation. In this case, the direction of polarization of the operating voltage and the orientation of the polar axes of the relevant piezoelectric layer are parallel in the first transducer element, whereas the direction of polarization of the operating voltage and the orientation of the polar axes of the relevant piezoelectric layer is antiparallel in the second transducer element.

The DC bias of the relevant transducer element is frequency-dependent in an advantageous variation. The frequency-dependent control voltage that is applied to the piezoelectric component can be generated by a driver arranged in a signal path. The signal path is connected to the relevant transducer element and is provided to supply a control voltage to the relevant transducer element.

The different transducer elements of the piezoelectric component can be biased by different DC control voltages. Through this, the frequency response of the loudspeaker arrangement can be flattened in a targeted way. Between the audio chip that provides an acoustic useful signal and the piezoelectric component that is driven by the useful signal, there can, for example, be a driver that has at least two signal paths on the output side. Each signal path is connected to the relevant transducer element and provided to control the transducer element. In the relevant signal path of the driver, the acoustic useful signal is superimposed with a preferably frequency-dependent DC control voltage, so that the transducer element is controlled with a superimposed control signal. The operating point of the relevant transducer element is selected through the setting of the relevant DC control voltage.

In one variation, a first frequency-dependent control voltage increases with decreasing frequency of the useful signal, and a second frequency-dependent control voltage increases with increasing frequency of the useful signal. The first signal path is provided to control the transducer elements turned toward the membrane and the second signal path is provided to control the transducer elements of the piezoelectric component that are turned away from the membrane.

There is the possibility of using the acoustic useful signal to establish at least two different DC control voltages, which are used to bias the transducer elements.

Different regions of the piezoelectric component, for example, its regions or transducer elements that are arranged side-by-side or one above the other, can be provided for control by signals with different frequency ranges, for example, with the low-frequency and the high-frequency portion of the useful signal spectrum.

In one variation, the transducer elements turned toward the membrane are controlled by a first frequency-dependent control voltage and the transducer elements turned away from the membrane are controlled by a second frequency-dependent control voltage. The control voltage source for the first control voltage is, for example, mainly driven by the lower-frequency portion of the useful signal spectrum, and the control voltage source for the second control voltage is mainly driven by the higher-frequency portion of the useful signal spectrum. The first control voltage then decreases, and the second control voltage increases with increasing frequency. The levels of the first and second control voltages are dependent on the amplitude of the relevant portion of the useful signal spectrum.

The membrane is suspended from a support. As the membrane oscillates, an acoustic wave is radiated into the surrounding medium. In an advantageous variation, the membrane is made of metal, for example, a metal foil or metal sheet.

An especially large membrane travel is achieved if the neutral plane, at which no deflection of the piezoelectric component takes place, lies at the boundary surface (interface) between the membrane and the piezoelectric component.

A region of the membrane that is capable of oscillation is in one variation arranged between two preferably similarly formed piezoelectric components. Preferably, the component arrangement has mirror symmetry with respect to a plane that corresponds to the resting position of the membrane. The transducer elements of different piezoelectric components that are turned toward each other and toward the membrane are preferably controlled in counter phase.

In an advantageous variation, the component arrangement is characterized by a relatively flat resonance curve. The important thing is the mechanical characteristic oscillation of the component arrangement.

A flat frequency response of the component arrangement is desired so that, in the useful region of the transfer function, for example, in the acoustic frequency range up to about 6 kHz, no "hole in the acoustic power," thus, a drop in performance, occurs. The flat resonance characteristic can be produced by stimulating at least two acoustic oscillation modes of the component arrangement. The frequency response of the component arrangement in an advantageous variation has at least two resonances, where each resonance is preferably broadly adjusted.

This means that the quality of the component arrangement with respect to the relevant oscillation mode that is to be stimulated is preferably relatively low, for example, less than 150. The component arrangement, therefore, is designed so that preferably at least two oscillation modes are stimulated by the piezoelectric component.

Dividing the piezoelectric component into at least two transducer elements that are different, but integrated in one body, is particularly advantageous for establishing a flat frequency response above the component arrangement. The transducer elements are preferably independently controllable and/or differently designed. The transducer elements, in this case, can be arranged side-by-side or one above the other.

The appropriate frequency response, especially the quality of the component arrangement with respect to the relevant oscillation mode can be influenced, for example, by suitable control of the transducer elements. Advantageous in this connection is a separate control of different transducer elements of the piezoelectric component by electrical biasing, where each transducer element can have its own operating point established, or by a frequency-dependent control voltage.

The resonance, frequency, and the quality of the component arrangement are dependent, among other things, on the structure and the suspension of the membrane on a support, but also on the structure of the piezoelectric component. A relatively low resonance Q factor, for example, a maximum of 50, is considered to be particularly advantageous.

The piezoelectric component in one variation is used as an electrical load for an amplifier, which amplifies audio signals to a necessary power level, for example, about 1 to 3V and 1 A. To prevent significant heating of an amplifier chip, the power loss at the load should be kept under 200 mW. A low load capacitance of, for example, under 2 µF is advantageous in this sense. A series circuitry of the transducer element is especially advantageous for this.

The field strength in the relevant piezoelectric layer becomes greater with smaller distance between the electrodes. The effective power to be converted in the piezoelectric component by means of the piezo effect increases quadratically with the electrical field strength. However, since a low capacitance of the piezoelectric component comes into being due to the series wiring, a low power loss can be achieved in spite of a low layer thickness. Consequently, if the transducer elements are connected in series, the dimensions, especially, the thickness, of the piezoelectric component can be reduced.

The advantage of the specified piezoelectric component lies in the fact that a transducer element is characterized by particularly low capacitance. If a series circuit is controlled by two identical transducer elements, the capacitance is reduced to about a quarter of the capacitance of a variation in which only one transducer element is realized in the body instead of two connected transducer elements. For the same voltage level, the field strength in the relevant piezoelectric layer is only half as great. Since the loss angle is voltage-dependent, the loss in current that leads to heat losses can be decreased by a factor of more than 10 in one variation.

In a piezoelectric component, efficient conversion of electrical energy to mechanical energy or vice versa with a current consumption base as low as possible is desired. The reactive power that is as low as possible should be generated in the relevant transducer element to reduce heating of the piezoelectric layers due to power loss and thus to prevent undesired depolarization of the piezoelectric layers. The low capacitance of the respective transducer element, therefore, is advantageous. This applies both to series connection and to parallel connection of the transducer elements.

The membrane is preferably clamped on the support so that mainly specific oscillation modes of the loudspeaker arrangement can be stimulated.

The membrane in one variation is affixed to the support only at its two opposite ends. The membrane can also be affixed to the support along a circumference. In these cases, the greatest travel is achieved in the central region of the membrane.

In another embodiment, a central region of the membrane can be affixed to the support. In this case, the greatest travel is achieved in the edge regions of the membrane.

With the membrane affixed to the support, so that not the entire periphery of the membrane, but rather edge regions of the membrane that are spaced apart, are affixed to the support, the oscillation spectrum can be advantageously modified by the fact that preferably only a limited number of oscillation modes is stimulated. In particular, oscillation modes of the loudspeaker arrangements that are considered to be useful can be supported, whereas certain oscillation modes of the loudspeaker arrangement are damped or even suppressed.

The choice of the oscillation modes to be stimulated can additionally be achieved by stacking at least two different transducer elements one on top of the other. In this case, the piezoelectric component preferably comprises at least four transducer elements. Transducer elements arranged one on top of the other form a transducer element stack. The spacing between the electrode planes is probably chosen to be greater in the region of a relevant transducer element stack that is turned toward the membrane than in the region turned away from the membrane.

The transducer element stacks in one variation are connected together via the third electrodes. The third electrodes each extend over two transducer element stacks and the neutral region.

Transducer elements of different transducer element stacks that are arranged side-by-side are preferably controlled by a common control signal with an AC voltage portion and/or a DC voltage portion. In an advantageous variation, transducer elements arranged side-by-side that are turned toward the membrane are controlled with a first control signal and other transducer elements arranged side-by-side that are turned away from the membrane are controlled with a second control signal.

The respective control signals with an AC voltage portion can be applied to the common electrodes of the transducer elements arranged side-by-side. Preferably, a DC voltage or a normal voltage is applied to the other electrodes of these transducer elements.

Alternatively, transducer elements of the relevant transducer element stacks that are arranged one above the other can be controlled by a common control signal with an AC voltage portion and/or DC voltage portion. The respective control signal with an AC voltage portion can, for example, be applied to the electrically connected electrodes of the transducer elements arranged one above the other. The DC voltage signal, or the null potential in this case, is preferably applied to the common electrodes of the transducer elements arranged side-by-side.

The transducer element stack that is spaced apart and realized in a body can, in principle, be controlled separately from each other. The transducer element stacks can be galvanically separated from each other.

BRIEF DESCRIPTION OF THE DRAWINGS

In what follows, the specified component and its advantageous embodiments are explained by means of schematic, not-to-scale drawings here.

The following list of reference symbols may be used in conjunction with the drawings:
10 Body of first piezoelectric component
10' Body of second piezoelectric component
11 First transducer element
12 Second transducer element
13 Neutral region of body
21 First electrodes
21a Outwardly lying first electrode
22 Second electrodes
22a Outwardly lying second electrode
23 Third electrodes 24 Other third electrodes
31, 32, 33, 34 Terminal wires
4 Membrane
4a Deformed membrane
51 Collecting electrode for connection of first electrodes 21
52 Collecting electrode for connection of second electrodes 22
53 Collecting electrode for connection of third electrodes 23
53a A terminal region of collecting electrode 53
54 External terminal for contact to additional third electrode 24
54a Terminal region of collecting electrode 54
6 Support
7 Gap in support
71, 72, 73 Attachment regions of membrane on support
8 Direction of deflection of membrane 4
91, 92 Direction of lateral deflection of body 10
C1, C2, C3, C4 Transducer elements
d1, d2 Distance between successive electrodes
Pl Piezoelectric layer
V Control signal
V~, $V_1$~, $V_2$~ Control signals with AC voltage component
$V_3$, $V_3$=, $V_4$ Control signals with DC component

DETAILED DESCRIPTION OF ILLUSTRATIVE EMBODIMENTS

Figure 14:
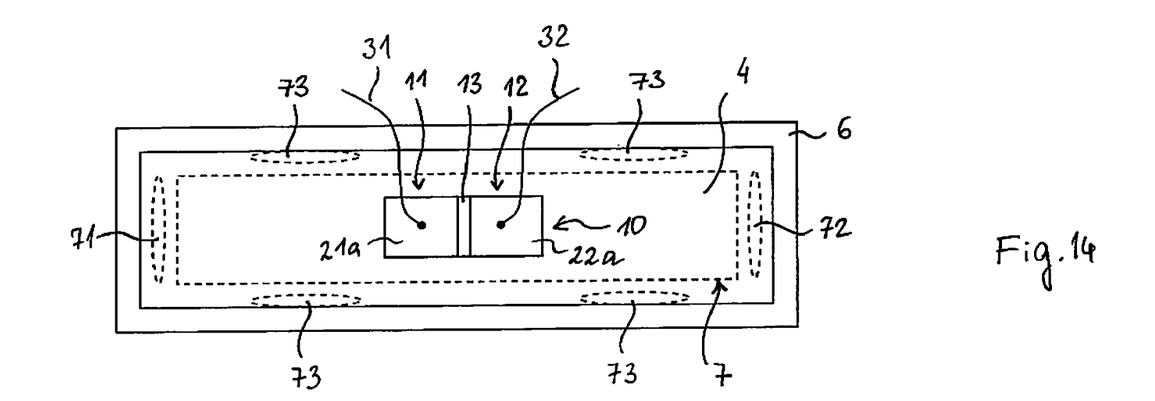
FIGS. 14 and 15 show top views of component arrangements with a support, a membrane clamped thereon, and a piezoelectric component firmly bonded to the membrane.
Figure 15:
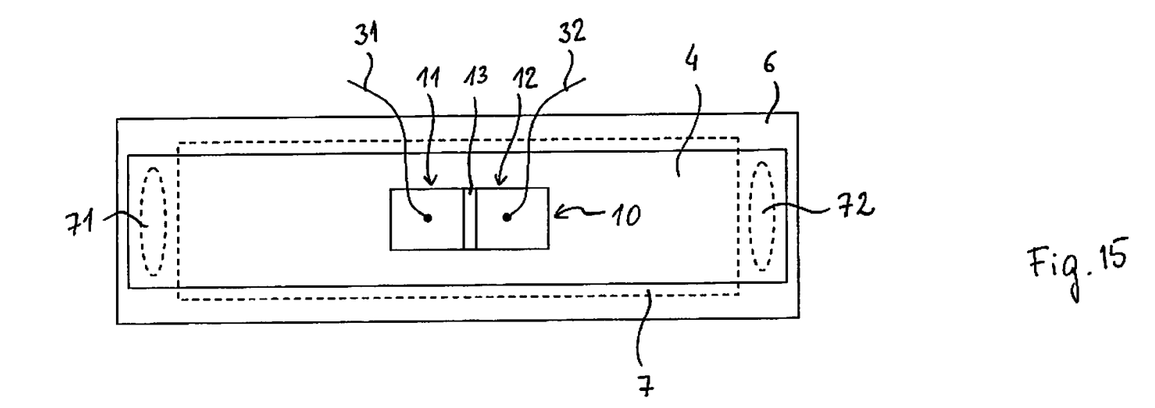

The piezoelectric component depicted in FIGS. 1A-13 is used, for example, in a component arrangement as in FIG. 14 or 15. The component is affixed to a membrane 4, which is clamped to a support 6.

A portion of the oscillation-capable region of membrane 4 is, in one variation, firmly bonded to the body 10 of the piezoelectric component. In another variation, shown as an example in FIG. 12A, a part of the oscillation-capable region of membrane 4 is arranged between two preferably identical piezoelectric components.

The piezoelectric component preferably serves to stimulate acoustic oscillations of membrane 4. Conversely, it is possible to use the piezoelectric component as a sensor element to detect the oscillation amplitude of a membrane, in particular, a microphone membrane or to register pressure acting on the membrane.

The body 10 of the piezoelectric component has piezoelectric layers and electrode planes that are arranged in alternating order, one above the other. The piezoelectric layers preferably contain a prepolarized ceramic material.

The body 10 comprises a first transducer element 11, a second transducer element 12, and a neutral region 13 arranged between the elements, which is essentially field-free, and preferably does not have polarization axes, for instance, in contrast to the regions of the transducer elements at 11 and 12.

The transducer elements 11 and 12 serve, in particular, to convert an electrical signal having an AC voltage portion to a mechanical oscillation or vice versa.

The body 10 is firmly bonded to membrane 4 over a large portion of its area, preferably all of its area. In an advantageous variation, both the first transducer element 11 and the second transducer element 12 are mechanically coupled to membrane 4. With that, the mechanical energy of the electrically stimulated oscillations of body 10 can be coupled especially efficiently to membrane 4.

Figures 12A, 13:
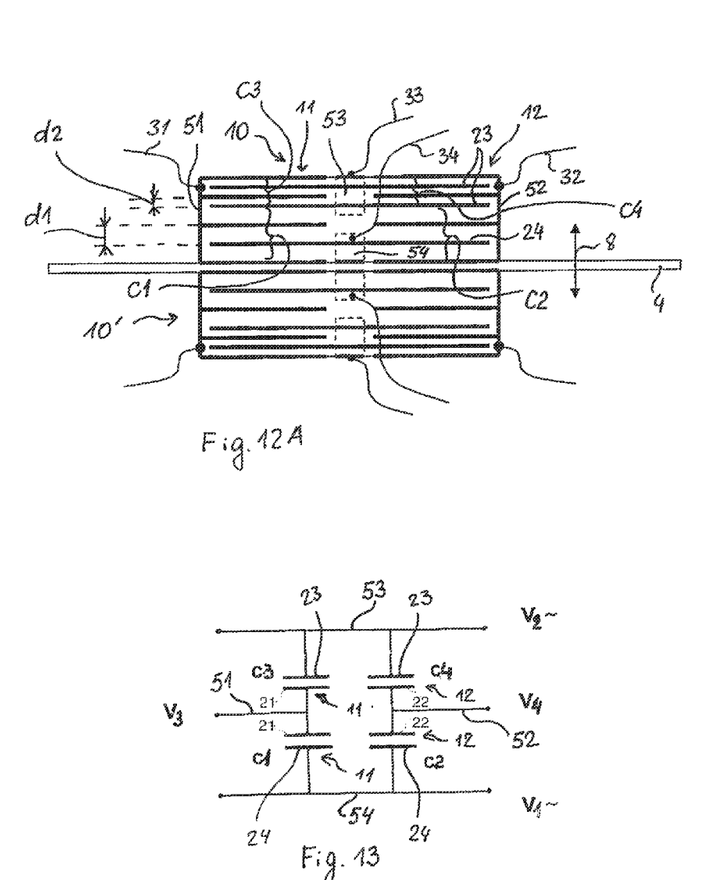
FIG. 12A shows, in cross section, a membrane with two piezoelectric components firmly bonded to it, each of which has four transducer elements.
FIG. 13 shows the equivalent circuit diagram of the respective piezoelectric component as in FIG. 12A.

The first transducer element 11 comprises a transducer element C1 or, see FIG. 12A, at least to electrically connected transducer elements C1 and C3, which are preferably arranged one above the other. The second transducer element 12 comprises a transducer element C2 or, see FIG. 12A, at least two electrically connected transducer elements, C2 and C4, which are preferably arranged one above the other.

The neutral region 13, in practical terms, does not undergo any mechanical deformation upon application of a control voltage to the transducer elements 11 and 12. The neutral region 13, therefore, is a kind of acoustic short circuit, which acts analogous to a clamping region.

The body 10 is preferably divided along its lengthwise axis into the first transducer element 11, the second transducer element 12, and the neutral region 13. In a cross-sectional view, the neutral region 13 extends in a vertical direction, preferably perpendicular to a lengthwise axis of body 10.

The body 10 has first electrodes 21, second electrodes 22, and third electrodes 23. The first electrodes 21 are electrically connected together by means of a first electrically conducting surface 51. The second electrodes 22 are electrically connected together by means of a second electrically conducting surface 52.

The first electrodes 21 are galavanically separated from the second and third electrodes 22 and 23. The second electrodes 22 are galavanically separated from the first and third electrodes 21 and 23. The third electrodes 23 are galavanically separated from the first and second electrodes 21 and 22.

A single third electrode, 23, preferably arranged in the interior of the body can, in principle, be sufficient to connect at least two transducer elements electrically. At least one of the third electrodes 23 can, however, also be arranged on the surface of the body, in one variation, at least on the main surface of body 10 turned toward membrane 4.

In an advantageous variation, there are arranged in body 10, a plurality of third electrodes 23 and 24 (see FIG. 12A), which are intended as common electrodes for at least two of the transducer elements 11, 12, C1, C2, C3, and C4. The respective third electrode is arranged between two electrodes of the first transducer element 11 that are electrically connected together and galavanically separated from the third electrodes. The respective third electrode is arranged between two electrodes of the second transducer element 12 that are electrically connected together and galavanically separated from the third electrodes.

Figures 1A, 1B:
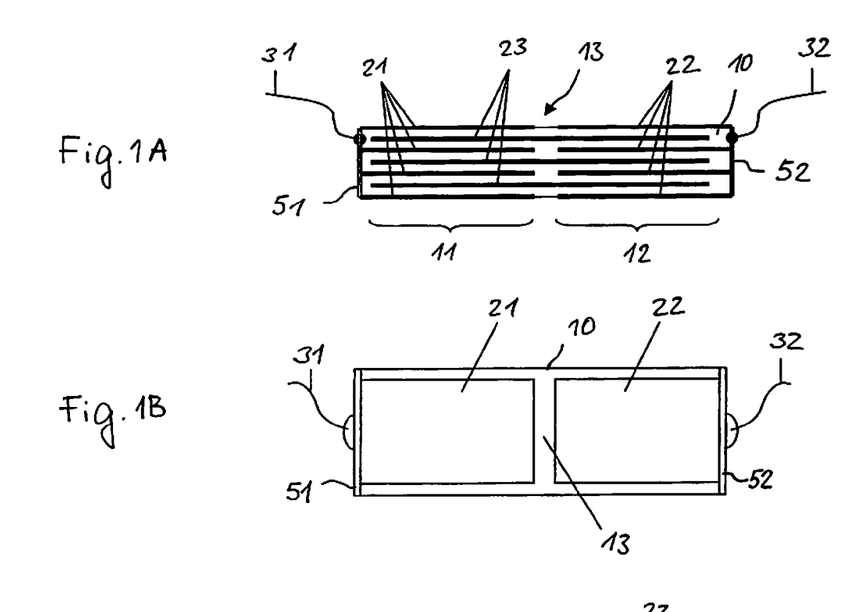
FIG. 1A shows, in cross section, a piezoelectric component with two transducer elements, which are electrically connected together via floating electrodes.
FIGS. 1B and 1C show the top views of the first and second electrode planes of the component in FIG. 1A.
Figure 1C:
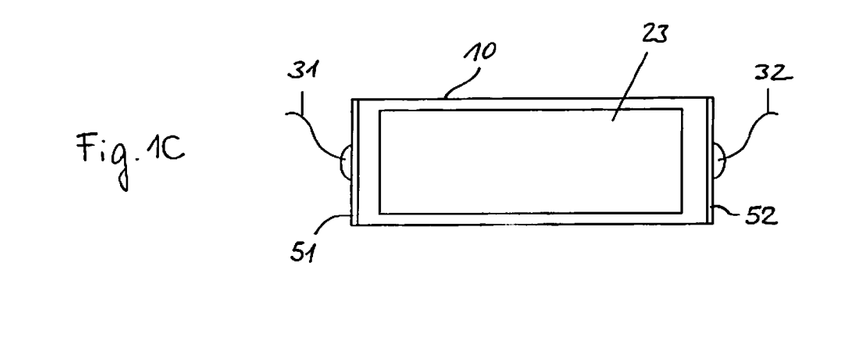

The third electrodes, 23, in the variation, in accordance with FIGS. 1A-1C are made floating, and they are galavanically separated from each other. In the variations, in FIGS. 3, 4A-4C, 5A-5D, and 12A-12D, the third electrodes 23 are connected to a third electrically conducting surface 53, and in FIG. 12A, at least one third electrode 24 is connected to another third electrically conducting surface 54.

An electrically conducting surface 51, 52, 53 or 54 arranged on the surface of the body can, on one hand, be provided as a collecting electrode to connect first, second or third electrodes 21, 22 or 23, 24, and, on the other hand, as an external terminal of the piezoelectric component. The respective conducting surface provided as a collecting electrode can basically be connected to any other conducting surface that is arranged on lengths of body 10, and it is provided as an external terminal of the component.

The electrically conducting surfaces 51, 52, 53, and 54 are arranged at least partially on the side surfaces of body 10. It is advantageous if the conducting surfaces are spaced apart as far as possible and, for example, arranged on different side surfaces. A terminal region of the respective conducting surface can also be arranged on a main surface of body 10. For example, the region 53a, 54a of the conducting surface 53 or 54 is arranged on a main surface of body 10 that is not intended as a clamping region of the body. In this regards, see FIGS. 4A, 4B, and 5A, 5B.

A terminal wire 31, 32, 33 or 34 is affixed to the respective external terminal 51 or 21a, 52 or 22A, 53 or 54 of the component.

The first electrodes 21 and the first regions of the third electrodes 23 are arranged one above the other in alternating sequence in the region of the first transducer element 11. The second electrodes 22 and the second regions of the third electrodes 23 are arranged one above the other in alternating sequence in the region of the second transducer element 12. Only the third electrodes 23 are arranged in the neutral region 13.

The first and the second electrodes 21 and 22 are arranged in the first electrode planes. The third electrodes 23 are arranged in the second electrode planes. The respective piezoelectric layer is preferably arranged between a first and a second electrode plane. The first and second electrode planes are, thus, arranged one above the other in alternating sequence.

The electrode planes comprise planes inwardly lying in the body and electrode planes arranged on the upper and lower side of the body. The electrode plane arranged on the upper side and lower side of body 10 can, in each case, according to use, be the first or the second electrode plane.

The external terminals of the components that are provided for contact through terminal wires 31, 32, 33, and 34 are arranged on side surfaces of body 10 or on the main surface turned away from membrane 4. The attachment of terminal wires on the main surface is especially advantageous if the body 10 has only a small thickness. For example, a region of the electrodes 21a or 22a (see FIGS. 5A-5D) arranged on the surface of body 10 and/or an outwardly lying third electrode can be used as the external terminal of the component.

FIG. 1B shows a view of a first electrode plane of body 10. A first electrode 21 and a second electrode 22 that is spaced at a distance from the first electrode are arranged in the corresponding first electrode plane.

FIG. 1C shows a view of the second electrode plane of body 10. A third electrode 23 is arranged in the corresponding second electrode plane.

The third electrodes 23 are preferably held back from the surface of the body 10 on all sides, optionally with the exception of a terminal region to the conducting surfaces 53 or 54. This correspondingly also applies to the first and second electrodes, 21 and 22, and their terminal regions to the conducting surfaces 51 and 52.

Figure 2:
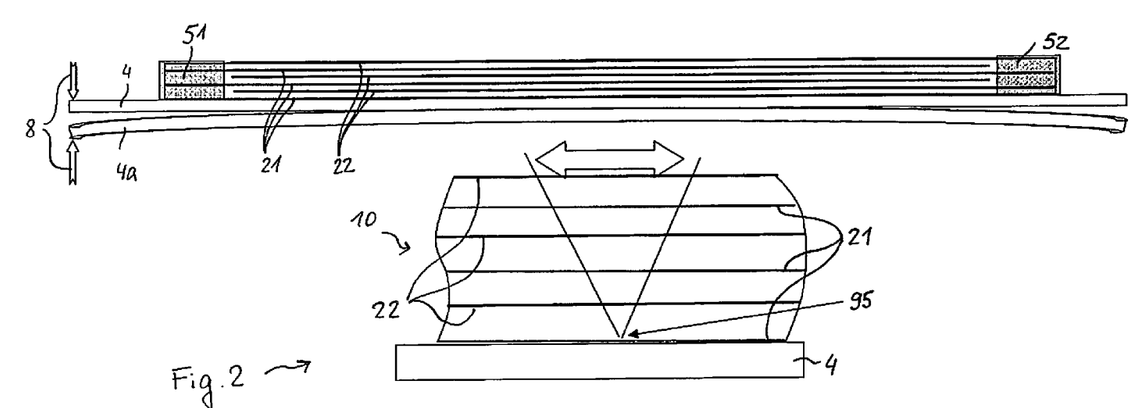
FIG. 2 shows, in cross section, a piezoelectric component that is affixed to a membrane capable of oscillation.
Figure 3:
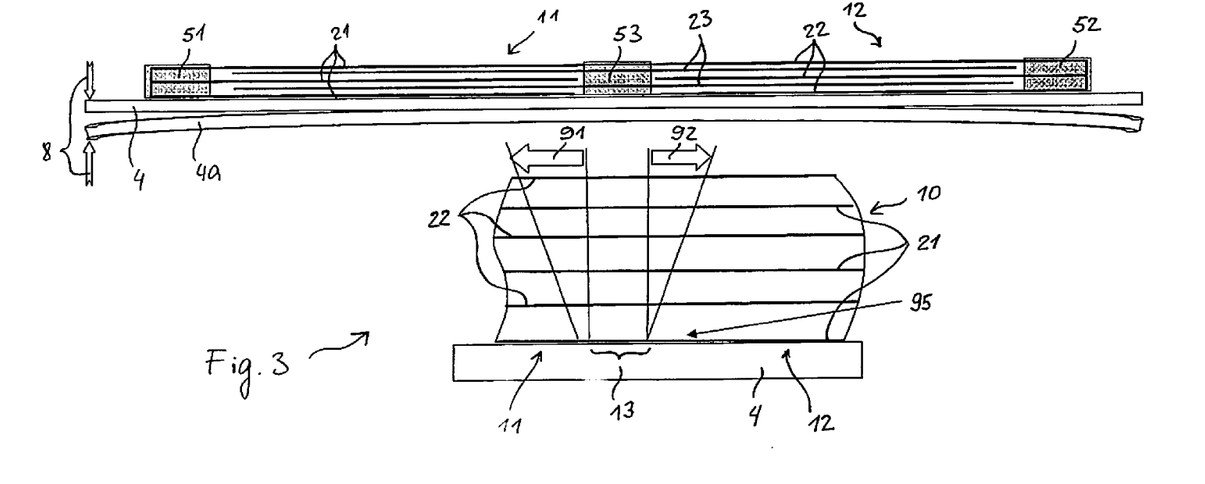
FIG. 3 shows, in cross section, a piezoelectric component with two integrated transducer elements, affixed to a membrane capable of oscillation.

In FIGS. 2 and 3, the effect of the piezo effect is explained in a piezoelectric component that is affixed to an oscillation-capable membrane 4 in an attachment region. Arrows 8 indicate the deflection of the membrane 4 driven by the piezoelectric component. Reference number 4 refers to the membrane in the ground state and reference number 4A refers to the deformed membrane.

In FIG. 2 above, a piezoelectric component with intermeshing first and second electrodes is shown. An enlarged section of body 10 is shown in FIG. 2 below.

In this case, only one transducer element is provided. The double-headed arrow shows that, upon application of an electrical voltage to electrodes 21 and 22, the deflection of the relevant piezoelectric layer takes place in a lateral plane.

The body expands or shrinks in a lateral direction with regard to a resting position as a consequence of a cumulative lateral effect with piezoelectric constant $d_{13}$. This effect is prevented on the side of the body turned toward the membrane, since the body is affixed to the membrane 4. This is why the body can neither expand nor shrink there in spite of the mechanical stress. Thus, its linear measurements in the attachment region do not change.

The greater the spacing between the corresponding piezoelectric layer and the attachment region of body 10, the greater will be the possible deflection of the piezoelectric material in the lateral direction. While the piezoelectric layers that are turned away from membrane 4, in FIG. 2, the upper layers, undergo an expansion at the corresponding polarity of the applied electrical voltage, the piezoelectric layers turned toward membrane 4 experiences a stress. The vertically uneven lateral deflection of body 10 leads to bending deformations of the body, which is why oscillations of membrane 4 can be produced.

FIG. 3 shows a piezoelectric component with two transducer elements 11 and 12 that are electrically connected by means of the common third electrodes 23. FIG. 3 below shows enlarged section of body 10.

Arrow 91 shows the direction of the lateral deflection of the body in the region of the first transducer element 11, and Arrow 92 shows the direction of the lateral deflection of the body in the region of the second transducer element 12. This deflection comes into being upon application of an electrical voltage to electrodes 21, 22, and/or possibly electrode 23.

The neutral region 13 is field-free and essentially free of mechanical stresses, since the material of the relevant piezoelectric material is not prepolarized in this region. The piezoelectric layers are quasi clamped in the neutral region 13. Since no deflection is possible in the neutral region, the deflection of the body at its free ends turned away from the neutral region will be all the greater.

Figure 4A:
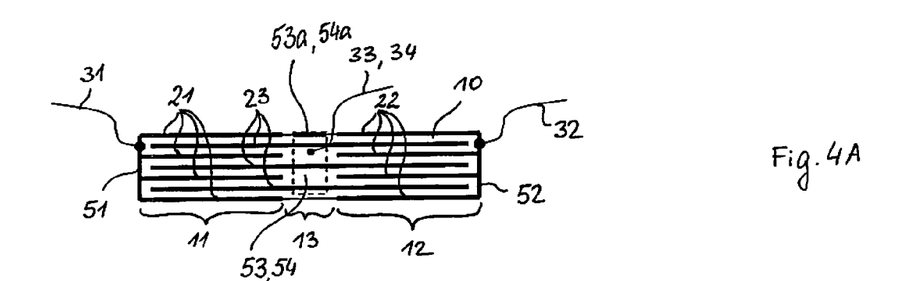
FIG. 4A shows, in cross section, a piezoelectric component with two transducer elements, which are electrically connected to each other via externally contactable electrodes.
Figure 4B:
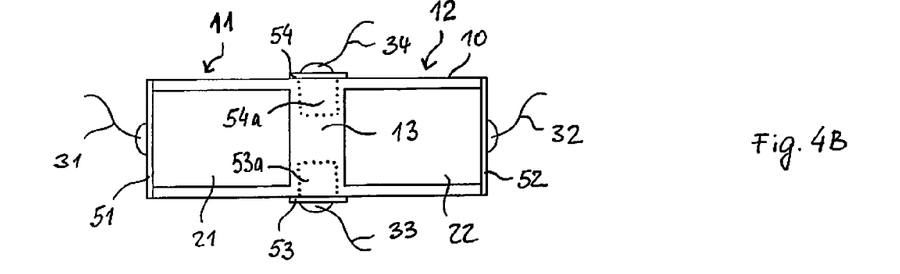
FIGS. 4B and 4C show top views of first and second electrode planes of the component in FIG. 4A.
Figure 4C:
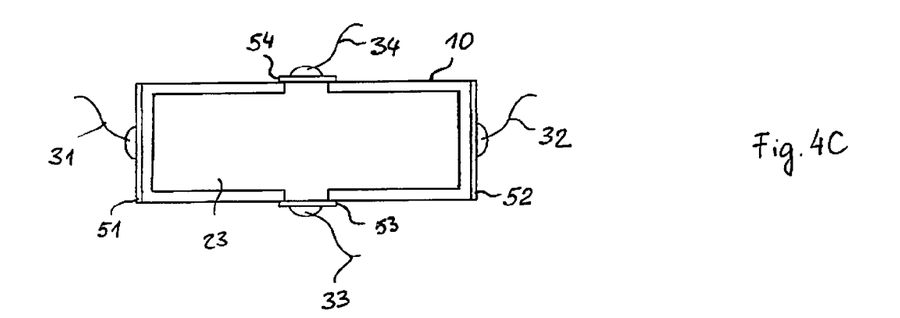
Figure 5A:
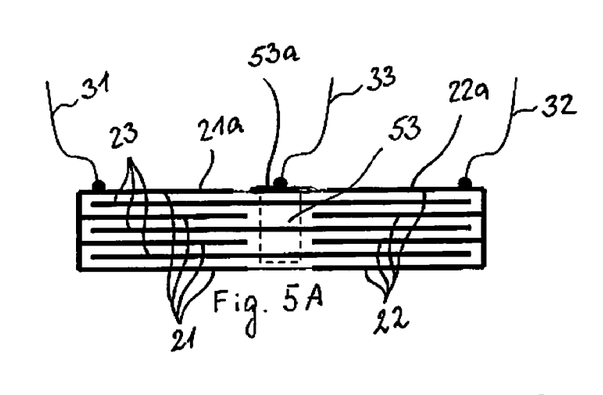
FIG. 5A shows a variation of the components shown in FIG. 4A in which all electrical terminals are directed toward one side of the body.
Figure 5B:
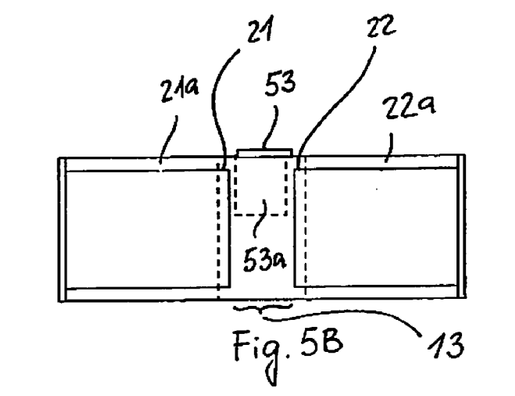
FIGS. 5B and 5C show top views of first and second electrode planes of the component in FIG. 5A.
Figure 5C:
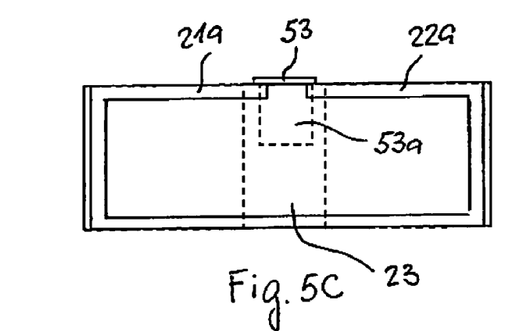
Figure 5D:
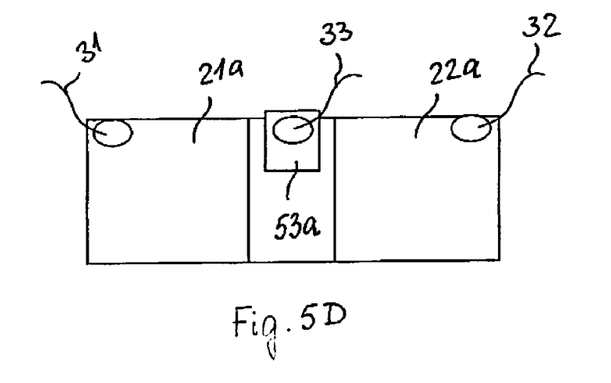
FIG. 5D shows a top view of a component in accordance with FIG. 5A.

The piezoelectric component shown in FIGS. 4A-4C is essentially mirror-symmetric with respect to a plane that runs perpendicular to the lengthwise axis of body 10. In addition, the component is mirror-symmetric with respect to a plane that is perpendicular to the electrodes and lies in the lengthwise axis of body 10. The corresponding third electrode 23 is connected both to the third conducting surface 53 and to the other third conducting surface 54 and, in principle, can be contacted via both conducting surfaces 53 and 54 or one of these surfaces.

The terminal wires 31, 32, 33, and 34 here are affixed to conducting surfaces 51, 52, 53, and 54, which are arranged on the side surfaces of body 10. Alternatively, terminal wire 31 can, according to FIG. 5A, be attached to the conducting surface formed by the uppermost first electrode 21a, terminal wire 32 can be affixed to the conducting surface formed by the uppermost second electrode 22A, terminal wire 33 can be attached in region 53a of conducting surface 53, and terminal wire 34 can be attached in region 54a of conducting surface 54.

The optional regions 53a and 54a of conducting surfaces 53 and 54 can, in principle, be omitted in all variations.

If necessary, for example, if the neutral region has a width <than 500 μm, the region 53a or 54a, which is intended as a terminal surface, can essentially be made as wide as the neutral region 13 or even wider than the neutral region 13 to be able to guarantee sufficient terminal area for the terminal wires 33 or 34. The first and second electrodes 21a and 22a, which lie in the same electrode plane as the conducting surface 53a and 54a, are correspondingly held back and, with respect to the lengthwise axis of the body, made shorter than in the inwardly lying electrode planes. The outwardly lined electrodes 21 and 22 can, but do not have to, be retracted from the edges or side surfaces of the body 10.

In the variation shown in FIGS. 5A-5D all of the electrical terminals of the component are directed toward one side of the body 10. All the electrical tunnels, thus, are arranged on the upper side of the body. The electrodes 21a and 22a arranged on the upper side of the body are, with respect to the lengthwise axis of the body, made shorter than the first and second electrodes 21 and 22 in the inward lying electrode planes. The electrodes 21a and 22a arranged on the upper side of the body are, however, made wider with respect to the directional width of the body than are the first and second electrodes 21 and 22.

FIGS. 6-9 show different possibilities for connection and control of the transducer elements 11 and 12. The corresponding variation can be used, on one hand, to generate prepolarization of the piezoelectric layers in the region of the transducer elements, 11 and 12, where a relatively large DC voltage is applied as polarization voltage at a relatively high temperature above the Curie point. The alignment of the polarization axes in the corresponding piezoelectric layer is dependent on the polarity of the applied polarization voltage.

The corresponding variation can, on the other hand, be used for control by a control signal with an AC voltage component. The symbol "~" indicates that the control signal has an AC voltage component. The symbol "=" indicates that the control signal has a DC voltage component.

Figure 6:
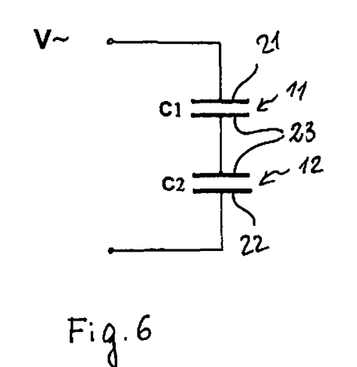
FIGS. 6, 7, 8, and 9 each show a variation for control of the piezoelectric component with two transducer elements.

In the variation in FIG. 6, a polarization voltage or a control signal V~ is applied to a series wiring of transducer elements 11 and 12 or C1 and C2. In this variation, the common electrodes 23, although each is made floating or electrically connected together, are not connected to an external circuit.

Figure 7:
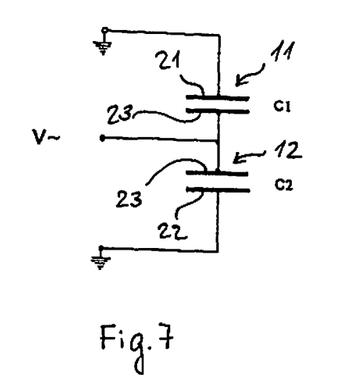

In the variation in FIG. 7, a polarization voltage or a common control signal V~ is applied to the common electrodes 23 of both transducer elements 11 and 12, or C1 and C2. The first electrodes 21 are connected to a first reference potential, and the second electrodes 22 are connected to a second reference potential. The corresponding reference potential can be, for example, ground, a null potential or a DC voltage with positive or negative polarity.

Different reference potentials for the first and the second transducer elements 11 and 12 can be advantageous. The first reference potential can, however, also be identical to the second reference potential. In the latter case, the transducer elements 11 and 12 are wired in parallel.

Figure 8:
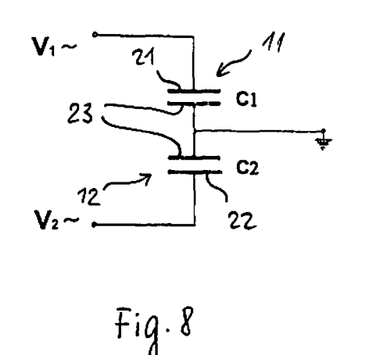
Figure 9:
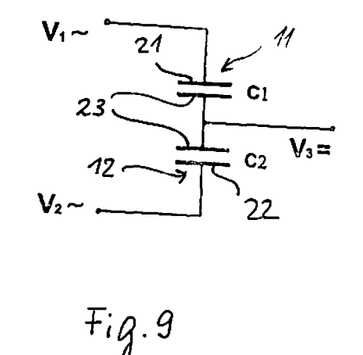

In the variation in FIGS. 8 and 9, a first polarization voltage or a first control signal $V_1$~ is applied to the first electrodes 21 of the first transducer element 11. A second polarization voltage or a second control voltage $V_2$~ is applied to the second electrodes 22 of the second transducer element 12. The common electrodes 23 of the transducer elements 11 and 12, in this case, are preferably connected to a reference potential. In FIG. 8, this is a null potential or ground. In FIG. 9, it is a positive or negative DC signal $V_3$=. The positive or negative sign for the reference potential refers to ground of the component arrangement in which the piezoelectric component is used.

The signals $V_1$~ and $V_2$~ can, for example, together yield a stereo signal.

The control signal applied to the first, second or third electrodes can basically, apart from the AC component, contain a DC component, for example, to produce a bias in transducer elements 11 and 12 and to establish an operating point. The control signal applied to the first, second or third electrodes, in this case, is the sum of the AC component and the DC component.

Figure 10:
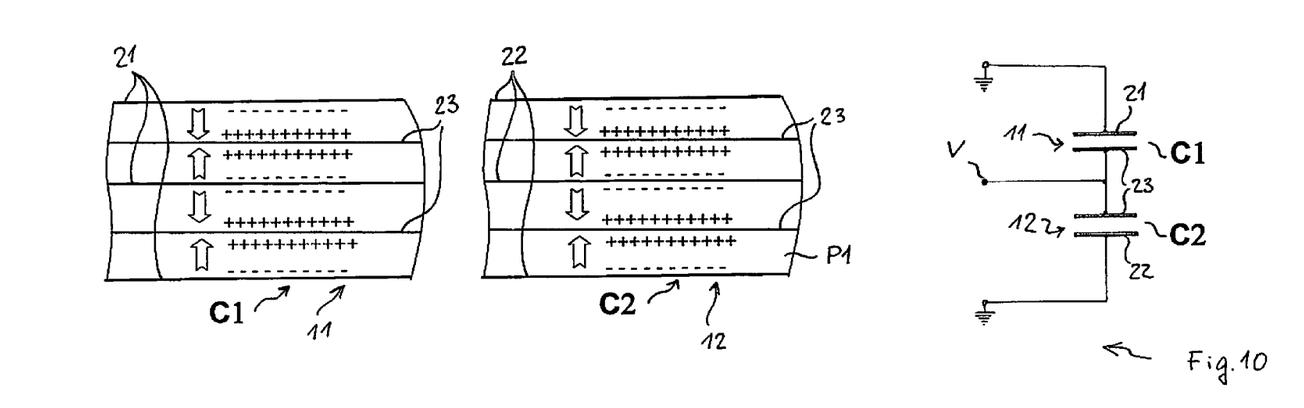
FIG. 10 shows the orientation of the polarization axes of the piezoelectric layers of the component when the transducer elements are controlled via the common electrodes.

In FIG. 10, the alignment of polarization of the corresponding piezoelectric layer in the transducer elements 11 and 12 are controlled by a control signal V with preset polarities indicated with block arrows. Control takes place via the common electrodes 23. The potential of electrodes 23 is well defined in this case, specifically in this variation set positive with respect to the potential of the first and second electrodes 21 and 22. If the electrodes 23 are controlled by a negative potential, a polarization opposite to the indicated direction of polarization is set in each piezoelectric layer.

The corresponding piezoelectric layer, for example, the bottom most layer PI, in this case, has the same direction of polarization (upward) in the region of the first and the second transducer elements 11 and 12.

Figure 11:
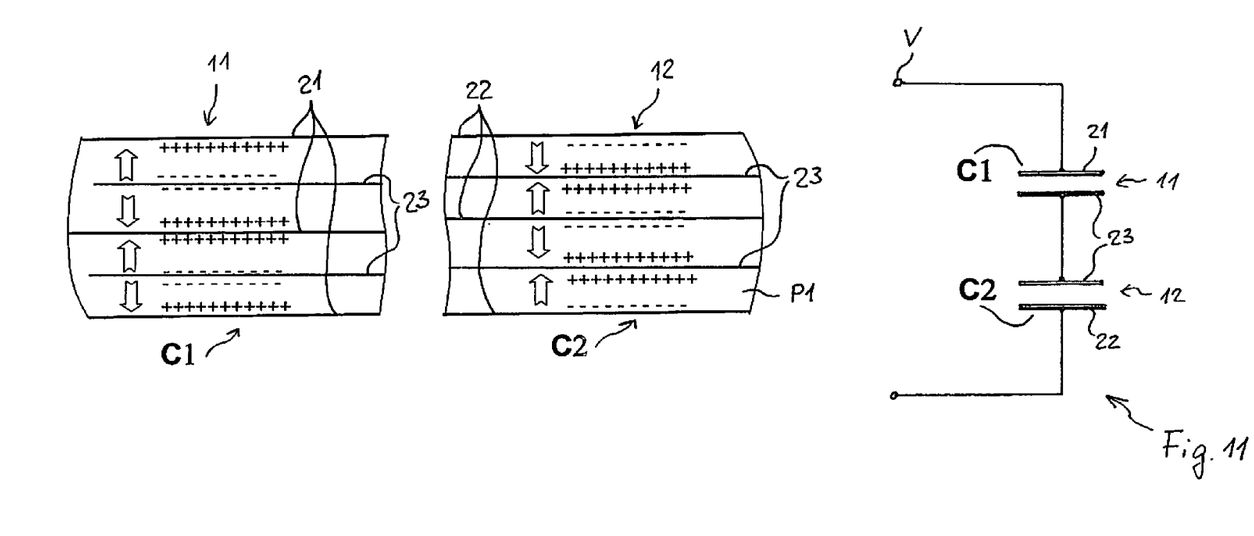
FIG. 11 shows the orientation of the polarization axes of the piezoelectric layers of the component in case of control of the series wiring of the transducer elements.

In FIG. 11, the direction of polarization of the corresponding piezoelectric layer, the control of the series wiring of transducer elements 11 and 12 by a control signal V with preset polarity is indicated with block arrows. The directions of polarization in the region of the first and second transducer elements 11 and 12 are antiparallel with respect to each other. Since the third electrodes 23, in this case, are floating or at least are not connected with a specific potential, the potential of the corresponding third electrode 23 is freely established. This potential is negative in the region of the first transducer element 11, with respect of the potential of the first electrodes 21, and positive in the region of the second transducer element 12, with respect to the potential of the second electrodes 22.

In the variation in FIG. 12A, the membrane 4 is arranged between two identical piezoelectric components. The body 10' of the second piezoelectric component essentially has the same properties as body 10 of the first piezoelectric component that is described below.

In the variation in FIG. 12A, the first transducer element 11 comprises two electrically connected transducer elements C1 and C3 arranged one above the other. The second transducer element 12 has two electrically connected transducer elements C2 and C4 arranged one above the other.

The thickness of the piezoelectric layers in the region of transducer elements C1 and C2 is d1. The transducer elements C3 and C4 have piezoelectric layers with a lesser thickness d2 than do the transducer elements C1 and C2. The transducer elements C1 and C2 with the relatively thicker piezoelectric layers are turned toward membrane 4. The transducer elements C3 and C4 with the relatively thinner piezoelectric layers are turned away from membrane 4.

With a smaller spacing between the differently polarized electrodes in the region of body 10 turned away from membrane 4, it is possible to achieve a greater deflection amplitude of the piezoelectric material. Through the change of spacing between the electrodes in the upper region of the corresponding transducer element 11 and 12 relative to its lower region, one therefore measures an especially efficient electromechanical conversion.

Figure 12B:
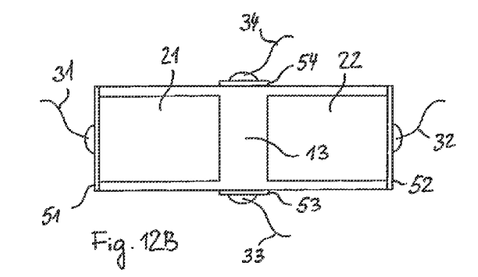
FIGS. 12B and 12C and 12D show top views of electrode planes of the component in FIG. 12A.
Figure 12C:
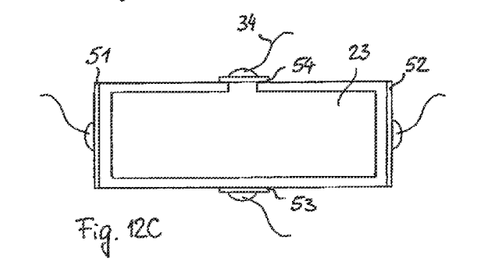
Figure 12D:
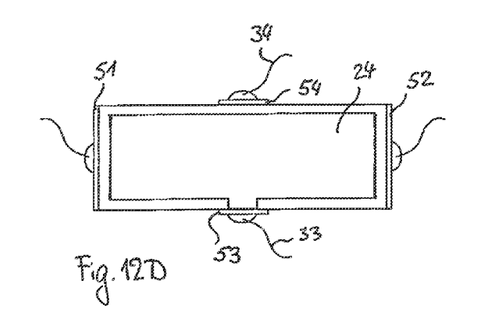

The equivalent circuit diagram of the piezoelectric component according to variation shown in FIGS. 12A-12C is shown in FIG. 13.

The first and second control signals $V_1$~ and $V_2$~ are preferably applied to the common electrodes of the transducer elements, which are arranged side-by-side. The control signal $V_1$~ is applied to the common electrode 24 of transducer elements C1 and C2 and the control signal $V_2$~ is applied to the common electrodes 23 of transducer elements C3 and C4.

The third and fourth control signals $V_3$ and $V_4$ are preferably applied to the common electrodes of the transducer elements arranged one above the other. The control signal $V_3$ is applied to the first electrodes 21 of converter elements C1 and C3, and control signal $V_4$ is applied to the second electrodes 22 of converter elements C2 and C4.

The corresponding control signal $V_1$~, $V_2$~, $V_3$~, and $V_4$ can, in each case, according to variation, be a reference potential, a DC voltage, an AC voltage or superimposed signal. Preferably, at least the control signals $V_1$~ and $V_2$~ contain an acoustic useful signal. Control signals $V_3$ and $V_4$ preferably contain a DC component or are identical to a reference potential.

The control signals $V_3$ and $V_4$ can be replaced by a common control signal. Control signals $V_1\sim$ and $V_2\sim$ can also be replaced by a common control signal.

Instead of just one third electrode 24, it is possible for a number of common electrodes 24 to be provided in the region of the transducer elements of C1 and C2. Conversely, instead of a number of third electrodes 23 in the region of transducer elements C3 and C4, only one common electrode 23 can be provided.

In principle, there is the possibility of applying a first bias to transducer elements C1 and C2 and a second bias to transducer elements C3 and C4. This can be advantageous for preferred stimulation of a specific oscillation mode of the component arrangement. In this case, a separate contacting of the third electrodes 23 and the other third electrodes 24 via the galvanically separated conducting surfaces 53 or 54, especially, is advantageous.

A third conducting surface 53 is provided as a collecting electrode to connect the third electrodes 23. The addition of third conducting surface 54 that is connected to the other third electrode 24 can also be provided as a collecting electrode to connect a number of third electrodes 24. In principle, there is the possibility of electrically connecting all of the third electrodes 23 and 24 within the body. For example, all of the third electrodes 23, 24 can be connected to one of the conducting surfaces 53 and 54 or to both conducting surfaces 53 and 54.

The third conducting surfaces 53 and 54 are arranged on oppositely lying side surfaces of body 10 in the variation in FIGS. 12A-12C. The third conducting surfaces can also be arranged on one, in the same side surface of body 10.

The transducer element C1 in all variations preferably has the same properties as the second transducer element, C2 that is arranged next to it. This refers, in particular, to the capacitance value of the transducer elements. In the variation shown in FIGS. 12A-12C and 13, the transducer elements C2 and C1 are preferably the same as each other, but are different from the transducer elements C3 and C4. The transducer elements C3 and C4 are preferably the same as each other.

Although in the variation in FIG. 12A, the transducer elements 11 and 12 are shown as a transducer element stack with just two transducer elements, it is also possible for more than two transducer elements to be arranged one above the other to form a transducer element stack in body 10. In this case, preferably, all of the transducer elements of the relevant stack are connected to one and the same electrical potential or are controlled by a common control signal. The control of parallel wiring of the transducer elements arranged one above the other by a common control signal is especially advantageous.

FIG. 14 shows a component arrangement, in particular, a loudspeaker arrangement or a microphone arrangement. The component arrangement comprises of a support 6 and a membrane 4. In support 6, there is a gap 7 or an opening over which a region of membrane 4 that is not attached can oscillate. Outside of the oscillation-capable region of membrane 4, there are attachment regions 71, 72, and 73, in which membrane 4 is firmly connected to support 6, for example, by means of an adhesive layer.

The attachment regions 71, 72, and 73 are spaced apart from each other. In the variation in FIG. 15, the membrane is clamped to support 6 only at its two opposite sides; see attachment region 71 and 72. Two sides of the membrane 4 are not clamped and, therefore, can freely oscillate. In this case, the width of the gap 7 is preferably greater than the width of the membrane 4.

In another variation, only one peripheral attachment region is formed instead of a number of attachment regions.

The design of the component and the component arrangement, in particular with respect to the number and form of the indicated components, is not limited to the examples shown in the figures. The material information does not represent any limitation on the design of the component.

Instead of a membrane, it is also possible to use another component that is suitable for coupling acoustic energy, preferably one that is capable of oscillation, for example, a resonance body or a retaining element.

In the variation in FIG. 12A, the control variations shown in FIGS. 6, 7, 8, and 9 are also possible with respect to the pairs of the transducer elements C1 and C2, C3 and C4 or C1 and C3 and C2 and C4. Different pairs can be galvanically connected together or galvanically separated from each other.

What is claimed is:

1. A piezoelectric component comprising:
    a body that comprises a slab, wherein electrically connected transducer elements are realized in the body and are spaced apart from each other by an essentially field-free neutral region of the body;
    a first transducer element having electrically connected first electrodes;
    a second transducer element having electrically connected second electrodes; and
    at least one third electrode arranged in the first and second transducer elements,
    wherein at least three electrodes chosen from the first and third electrodes are arranged in an alternating sequence, and wherein at least three electrodes chosen from the second and third electrodes are arranged in an alternating sequence, and
    wherein the neutral region is perpendicular to planes in which the first, second and the at least one third electrodes are arranged.

2. The component as in claim 1, wherein the at least one third electrode comprises at least one ground electrode.

3. The component as in claim 1, wherein the first and second transducer elements are electrically connected in series.

4. The component as in claim 1, wherein the first and second transducer elements are connected in parallel.

5. The component as in claim 1,
    wherein the body comprises piezoelectric layers, and
    wherein a thickness of the piezoelectric layers in a first lateral region of the body that is attached to a membrane is greater than a thickness in a second lateral region of the body that is not attached to the membrane.

6. The component as in claim 3, wherein a control signal is applied to a series wiring of the first and second transducer elements.

7. The component as in claim 1, wherein a control signal is applied to the at least one third electrode or to the first and second electrodes.

8. The component as in claim 1, wherein a first control signal is applied to the first electrodes and a second control signal is applied to the second electrodes.

9. The component as in claim 1, wherein at least one third electrode is provided to supply a DC voltage.

10. The component as in claim 5, wherein polarization axes of a relevant piezoelectric layer are aimed in the same or opposite direction in a region of the first and the second transducer elements.

11. The component as in claim 10, wherein, in operation of the piezoelectric component, a control voltage is applied so that an electrical field in the relevant piezoelectric layer is aimed in the same or opposite direction in the region of the first and second transducer elements.

12. A component arrangement comprising:
   at least one piezoelectric component as in claim 1; and
   a membrane that is capable of oscillation, the piezoelectric component being attached to the membrane.

13. The component arrangement as in claim 12, wherein a region of the membrane is arranged between two piezoelectric components.

14. The component arrangement as in claim 12, wherein the membrane is suspended on a support in at least two regions that are spaced apart.

15. A component arrangement comprising:
   a membrane; and
   a piezoelectric component firmly bonded to the membrane, the piezoelectric component comprising at least two transducer elements arranged one above the other, the two transducer elements having different thicknesses of piezoelectric layers, each of the piezoelectric layers of different thickness being arranged between two neighboring, differently polarized electrodes, respectively.

16. The transducer element as in claim 15, wherein the at least two transducer elements are independently controllable.

17. A piezoelectric component comprising:
   a body, wherein electrically connected transducer elements are realized in the body and are spaced apart from each other by an essentially field-free neutral region of the body;
   a first transducer element having electrically connected first electrodes;
   a second transducer element having electrically connected second electrodes; and
   at least one third electrode arranged in the first and second transducer elements, wherein the at least one third electrode comprises at least one ground electrode;
   wherein at least three electrodes chosen from the first and third electrodes are arranged in an alternating sequence, and wherein at least three electrodes chosen from the second and third electrodes are arranged in an alternating sequence; and
   wherein the neutral region is perpendicular to planes in which the first, second and the at least one third electrodes are arranged.

18. A piezoelectric component comprising:
   a body, wherein electrically connected transducer elements are realized in the body and are spaced apart from each other by an essentially field-free neutral region of the body;
   a first transducer element having electrically connected first electrodes;
   a second transducer element having electrically connected second electrodes; and
   at least one third electrode arranged in the first and second transducer elements,
   wherein at least three electrodes chosen from the first and third electrodes are arranged in an alternating sequence, and wherein at least three electrodes chosen from the second and third electrodes are arranged in an alternating sequence,
   wherein the neutral region is perpendicular to planes in which the first, second and the at least one third electrodes are arranged,
   wherein the body comprises piezoelectric layers, and
   wherein a thickness of the piezoelectric layers in a first lateral region of the body that is attached to a membrane is greater than a thickness in a second lateral region of the body that is not attached to the membrane, wherein layers of different thicknesses are arranged between neighboring, differently polarized electrodes, respectively.

* * * * *